US011708266B2

United States Patent
Jeon et al.

(10) Patent No.: US 11,708,266 B2
(45) Date of Patent: Jul. 25, 2023

(54) HIGHLY STRETCHABLE THREE-DIMENSIONAL PERCOLATED CONDUCTIVE NANO-NETWORK STRUCTURE, METHOD OF MANUFACTURING THE SAME, STRAIN SENSOR INCLUDING THE SAME AND WEARABLE DEVICE INCLUDING THE SAME

(71) Applicant: Korea Advanced Institute of Science and Technology, Daejeon (KR)

(72) Inventors: Seok-Woo Jeon, Daejeon (KR); Dong-hwi Cho, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 81 days.

(21) Appl. No.: 17/322,170

(22) Filed: May 17, 2021

(65) Prior Publication Data

US 2022/0009772 A1    Jan. 13, 2022

Related U.S. Application Data

(62) Division of application No. 16/330,936, filed as application No. PCT/KR2016/014524 on Dec. 12, 2016, now Pat. No. 11,040,873.

(30) Foreign Application Priority Data

Sep. 19, 2016    (KR) .................. 10-2016-0119204

(51) Int. Cl.
*B82B 3/00*    (2006.01)
*H01B 1/22*    (2006.01)
(Continued)

(52) U.S. Cl.
CPC .............. *B82B 3/0023* (2013.01); *B82B 3/00* (2013.01); *H01B 1/22* (2013.01); *H01B 1/24* (2013.01);
(Continued)

(58) Field of Classification Search
CPC ........ H05K 1/028; H05K 1/28; H01L 27/281; B82B 3/0038; B82B 3/00; B82Y 40/00
See application file for complete search history.

(56) References Cited

U.S. PATENT DOCUMENTS 11,040,873  B2    6/2021   Jeon et al.
2016/0192501 A1    6/2016   Yan et al.

FOREIGN PATENT DOCUMENTS

CN    105733267    7/2016
JP    2008037906 A    2/2008
(Continued)

OTHER PUBLICATIONS

U.S. Restriction Requirement dated May 8, 2020 for U.S. Appl. No. 16/330,936; 10 Pages.
(Continued)

*Primary Examiner* — Khanh T Nguyen
(74) *Attorney, Agent, or Firm* — Daly Crowley Mofford & Durkee, LLP

(57) ABSTRACT

In a method of manufacturing a highly stretchable three-dimensional (3D) percolated conductive nano-network structure, a 3D nano-structured porous elastomer including patterns distributed in a periodic network is formed. A surface of the 3D nano-structured porous elastomer is changed to a hydrophilic state. A polymeric material is conformally adhered on the surface of the 3D nano-structured porous elastomer. The surface of the 3D nano-structured porous elastomer is wet by infiltrating a conductive solution in which a conductive material is dispersed. A 3D (Continued)

percolated conductive nano-network coupled with the 3D nano-structured porous elastomer is formed by evaporating a solvent of the conductive solution and removing the polymeric material.

4 Claims, 17 Drawing Sheets

(51) Int. Cl.
*H01B 1/24* (2006.01)
*B82Y 15/00* (2011.01)
*B82Y 30/00* (2011.01)
*B82Y 40/00* (2011.01)

(52) U.S. Cl.
CPC ............... *B82Y 15/00* (2013.01); *B82Y 30/00* (2013.01); *B82Y 40/00* (2013.01)

(56) References Cited

FOREIGN PATENT DOCUMENTS

| KR | 10-2011-0027965 A | 3/2011 | |
|---|---|---|---|
| KR | 10-2016-0080132 A | 7/2016 | |
| WO | WO 2014/165634 A2 * | 10/2014 | ............. H01L 51/00 |
| WO | WO 2014/200428 | 12/2014 | |

OTHER PUBLICATIONS

Response to U.S. Restriction Requirement dated May 8, 2020 for U.S. Appl. No. 16/330,936; Response filed Jun. 18, 2020; 1 Page.
U.S. Non-Final Office Action dated Sep. 24, 2020 for U.S. Appl. No. 16/330,936; 15 Pages.
Response to U.S. Non-Final Office Action dated Sep. 24, 2020 for U.S. Appl. No. 16/330,936; Response filed Dec. 23, 2020; 9 Pages.
U.S. Notice of Allowance dated Mar. 4, 2021 for U.S. Appl. No. 16/330,936; 10 Pages.
PCT International Search Report dated Jun. 15, 2017 for International Application No. PCT/KR2016/014524; 6 Pages.
Chun et al., "Highly Conductive, Printable and Stretchable Composite Films of Carbon Nanotubes and Silver;" Nature Nanotechnology, Letters, vol. 5; Published Nov. 28, 2010; pp. 853-857; 5 Pages.
Genzer et al., "Creating Long-Lived Superhydrophobic Polymer Surfaces Through Mechanically Assembled Monolayers;" Science Magazine, vol. 290; Dec. 15, 2000; pp. 2130-2133; 5 Pages.
Park et al., "Three-Dimensional Nanonetworks for Giant Stretchability in Dielectrics and Conductors;" Article in Nature Communications, vol. 3, No. 916; Published Jun. 26, 2012; 24 Pages.
Sekitani et al., "A Rubberlike Stretchable Active Matrix Using Elastic Conductors;" Science Magazine, vol. 321; Sep. 12, 2008; pp. 1468-1472; 6 Pages.

* cited by examiner

HIGHLY STRETCHABLE THREE-DIMENSIONAL PERCOLATED CONDUCTIVE NANO-NETWORK STRUCTURE, METHOD OF MANUFACTURING THE SAME, STRAIN SENSOR INCLUDING THE SAME AND WEARABLE DEVICE INCLUDING THE SAME

CROSS-REFERENCE TO RELATED APPLICATION

This application is a divisional application of U.S. application Ser. No. 16/330,936 filed on Mar. 6, 2019, which is a U.S. National Stage of PCT/KR2016/014524 filed in the Korean language on Dec. 12, 2016, entitled "HIGHLY STRETCHABLE THREE-DIMENSIONAL CONDUCTIVE NANO-NETWORK STRUCTURE, METHOD FOR MANUFACTURING SAME, TENSILE SENSOR COMPRISING SAME, AND WEARABLE DEVICE," which application claims the priority benefit of Korean Patent Application No. 10-2016-0119204 filed on Sep. 19, 2016 in the Korean Intellectual Property Office, the disclosure of which is incorporated herein by reference.

BACKGROUND

1. Technical Field

Example embodiments relate generally to nano-structures, and more particularly to highly stretchable three-dimensional (3D) percolated conductive nano-network structures, methods of manufacturing the highly stretchable 3D percolated conductive nano-network structures, and strain sensors and wearable devices including the highly stretchable 3D percolated conductive nano-network structures.

2. Description of the Related Art

Stretchable electrodes have been applied to various fields such as artificial electronic skins, flexible displays, and strain sensors. Recently, as potential applications of various strain sensors such as health rehabilitation therapy, personal health monitoring, structural defect monitoring, and athlete performance monitoring have been reviewed, research has been actively conducted on flexible, stretchable and tensile sensitive strain sensors. Particularly, high stretchable and high sensitive strain sensors have been applied in fields such as biomechanics, physiology, and kinesiology, which require relatively large deformation.

Unlike conventional flexible electrodes which need to maintain constant conductivity while having elasticity, stretchable electrodes should have high elasticity and at the same time have continuous electrical characteristic change according to tensile strain so that the stretchable electrodes are used as strain sensors. However, it is difficult to apply conventional strain sensors to nonplanar structures (especially human body) where bending and tensile strain coexist. In order to solve this problem, a method of changing the type of conductive material has been studied, however, there is a problem in that it is not possible to simultaneously satisfy two important factors of stretchability and sensitivity due to material limitations by merely changing the conductive material.

SUMMARY

Some example embodiments provide a method of manufacturing a highly stretchable three-dimensional (3D) percolated conductive nano-network structure capable of having improved characteristics.

Some example embodiments provide a highly stretchable 3D percolated conductive nano-network structure obtained by the method.

Some example embodiments provide a strain sensor and a wearable device including the highly stretchable 3D percolated conductive nano-network structure.

According to example embodiments, in a method of manufacturing a highly stretchable three-dimensional (3D) percolated conductive nano-network structure, a 3D nano-structured porous elastomer including patterns distributed in a periodic network is formed. A surface of the 3D nano-structured porous elastomer is changed to a hydrophilic state. A polymeric material is conformally adhered on the surface of the 3D nano-structured porous elastomer. The surface of the 3D nano-structured porous elastomer is wet by infiltrating a conductive solution in which a conductive material is dispersed. A 3D percolated conductive nano-network coupled with the 3D nano-structured porous elastomer is formed by evaporating a solvent of the conductive solution and removing the polymeric material.

In some example embodiments, an electrical characteristic of the 3D percolated conductive nano-network may be determined based on a number of times of infiltration of the conductive solution.

In some example embodiments, a density of the conductive material included in the 3D percolated conductive nano-network may increase and an initial resistance of the 3D percolated conductive nano-network may decrease as the number of times of the infiltration of the conductive solution increases.

In some example embodiments, a range of reversible tensile strain in which the electrical characteristic of the 3D percolated conductive nano-network is maintained may increase as the number of times of the infiltration of the conductive solution increases.

In some example embodiments, the 3D percolated conductive nano-network may be formed along the surface of the 3D nano-structured porous elastomer.

In some example embodiments, the conductive material may be based on a material selected from the group consisting of carbon nano-tube (CNT), graphene, silver nanowire, and liquid metal.

In some example embodiments, the 3D nano-structured porous elastomer may include a plurality of layers, each of the plurality of layers may include the patterns distributed in the periodic network, and a size of each of a plurality of pores included in each of the plurality of layers may be about 1 to 2000 nm.

In some example embodiments, the 3D nano-structured porous elastomer may be formed using a material selected from the group consisting of polydimethylsiloxane (PDMS), PDMS modified urethane acrylate (PUA), perfluoropolyether (PFPE), polyethylene (PE).

In some example embodiments, when forming the 3D nano-structured porous elastomer, a photoresist layer may be formed on a substrate. A photoresist pattern having a porous structure may be formed by patterning the photoresist layer. A liquid elastomer may be infiltrated using the photoresist pattern as a template. A post-treatment may be performed on the liquid elastomer. The 3D nano-structured porous elastomer may be obtained by removing the photoresist pattern.

In some example embodiments, when changing the surface of the 3D nano-structured porous elastomer to the hydrophilic state, a plasma treatment or an ultraviolet (UV)/ozone ($O_3$) treatment may be performed on the 3D nano-structured porous elastomer.

According to example embodiments, a highly stretchable three-dimensional (3D) percolated conductive nano-network structure includes a 3D nano-structured porous elastomer and a 3D percolated conductive nano-network. The 3D nano-structured porous elastomer includes patterns distributed in a periodic network. The 3D percolated conductive nano-network includes a conductive material and is coupled with the 3D nano-structured porous elastomer. The 3D percolated conductive nano-network is formed along a surface of the 3D nano-structured porous elastomer.

In some example embodiments, the 3D percolated conductive nano-network may be formed by infiltrating a conductive solution in which the conductive material is dispersed into the 3D nano-structured porous elastomer, and an electrical characteristic of the 3D percolated conductive nano-network may be determined based on a number of times of infiltration of the conductive solution.

In some example embodiments, a density of the conductive material included in the 3D percolated conductive nano-network may increase and an initial resistance of the 3D percolated conductive nano-network may decrease as the number of times of the infiltration of the conductive solution increases.

In some example embodiments, a range of reversible tensile strain in which the electrical characteristic of the 3D percolated conductive nano-network is maintained may increase as the number of times of the infiltration of the conductive solution increases.

In some example embodiments, the conductive material may be based on a material selected from the group consisting of carbon nano-tube (CNT), graphene, silver nanowire, and liquid metal.

In some example embodiments, the highly stretchable 3D percolated conductive nano-network structure may further include buried patterns. The buried patterns may be formed of a material having a refractive index same as that of the 3D nano-structured porous elastomer and may fill pores included in the 3D nano-structured porous elastomer.

According to example embodiments, a strain sensor includes a highly stretchable three-dimensional (3D) percolated conductive nano-network structure. The highly stretchable 3D percolated conductive nano-network structure includes a 3D nano-structured porous elastomer and a 3D percolated conductive nano-network. The 3D nano-structured porous elastomer includes patterns distributed in a periodic network. The 3D percolated conductive nano-network includes a conductive material and is coupled with the 3D nano-structured porous elastomer. The 3D percolated conductive nano-network is formed along a surface of the 3D nano-structured porous elastomer.

In some example embodiments, a resistance of the strain sensor may be maintained regardless of bending of a supporting layer to which the strain sensor is attached as a thickness of the supporting layer decreases.

According to example embodiments, a wearable device includes a strain sensor, a flexible frame and a resistance measurer. The strain sensor includes a highly stretchable three-dimensional (3D) percolated conductive nano-network structure. The strain sensor is mounted on the flexible frame. The resistance measurer is connected to the strain sensor. The highly stretchable 3D percolated conductive nano-network structure includes a 3D nano-structured porous elastomer and a 3D percolated conductive nano-network. The 3D nano-structured porous elastomer includes patterns distributed in a periodic network. The 3D percolated conductive nano-network includes a conductive material and is coupled with the 3D nano-structured porous elastomer. The 3D percolated conductive nano-network is formed along a surface of the 3D nano-structured porous elastomer.

In some example embodiments, the wearable device may further include a processor. The processor may perform a predetermined data processing operation based on an output of the resistance measurer.

Accordingly, the highly stretchable 3D percolated conductive nano-network structure according to example embodiments may include the 3D percolated conductive nano-network coupled with the 3D nano-structured porous elastic polymeric material structure. The stretching limit may be improved by the tensile strain distribution effect by the 3D porous nano-structured pattern. The 3D percolated conductive nano-network may be efficiently manufactured with a relatively small amount of conductive material because the 3D percolated conductive nano-network is formed within a framework of the 3D nano-structure. In addition, when the tensile strain is applied, the 3D nano-structure which is a substrate may be organically changed, and the 3D percolated conductive nano-network may also be efficiently changed. Accordingly, the highly stretchable 3D percolated conductive nano-network structure may be used as a base technology capable of implementing an improved level of stretchable electronic device, and may be utilized as the strain sensor requiring a change in electrical characteristics depending on the tension strain.

DETAILED DESCRIPTION OF THE EMBODIMENTS

Figure 1:
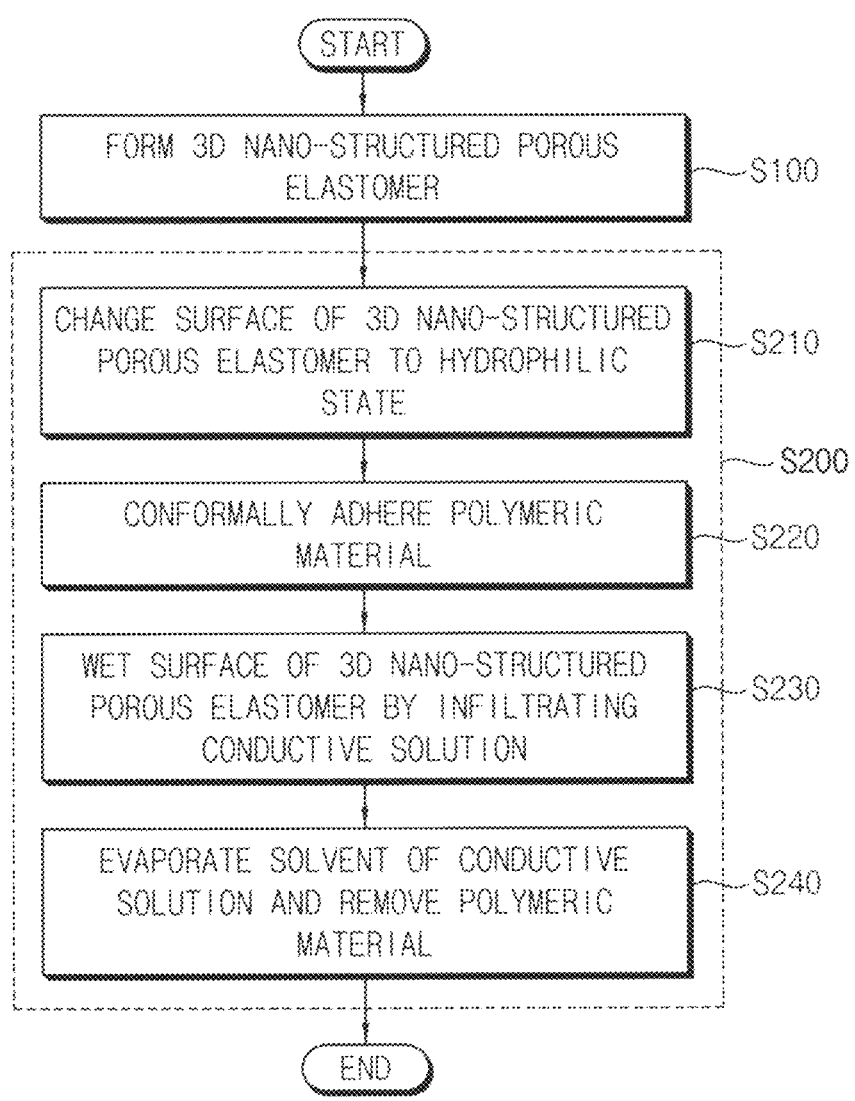
FIG. 1 is a flowchart illustrating a method of manufacturing a highly stretchable three-dimensional (3D) percolated conductive nano-network structure according to example embodiments.

Various example embodiments will be described more fully with reference to the accompanying drawings, in which embodiments are shown. This inventive concept may, however, be embodied in many different forms and should not be construed as limited to the embodiments set forth herein.

Rather, these embodiments are provided so that this disclosure will be thorough and complete, and will fully convey the scope of the inventive concept to those skilled in the art.

Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

If a particular embodiment is otherwise feasible, the functions or operations specified in a particular block may occur differently from the order specified in the flowchart. For example, two consecutive blocks may actually be performed at substantially the same time, and the blocks may be performed backwards depending on the associated function or operation.

The above and other features of the inventive concept will become more apparent by describing in detail example embodiments thereof with reference to the accompanying drawings. The same reference numerals are used for the same elements in the drawings and redundant explanations for the same elements are omitted.

FIG. 1 is a flowchart illustrating a method of manufacturing a highly stretchable three-dimensional (3D) percolated conductive nano-network structure according to example embodiments.

Referring to FIG. 1, in a method of manufacturing a highly stretchable 3D percolated conductive nano-network structure according to example embodiments, a 3D nano-structured porous elastomer including patterns distributed in a periodic network is formed (step S100). A 3D percolated conductive nano-network coupled with the 3D nano-structured porous elastomer is formed (step S200).

In step S200, a surface of the 3D nano-structured porous elastomer is changed to a hydrophilic state (step S210), a polymeric material is conformally adhered on the surface of the 3D nano-structured porous elastomer (step S220), the surface of the 3D nano-structured porous elastomer is wet by infiltrating a conductive solution in which a conductive material is dispersed (step S230), a solvent of the conductive solution is evaporated and the polymeric material is removed (step S240), and thus the 3D percolated conductive nano-network coupled with the 3D nano-structured porous elastomer is formed.

Figure 2:
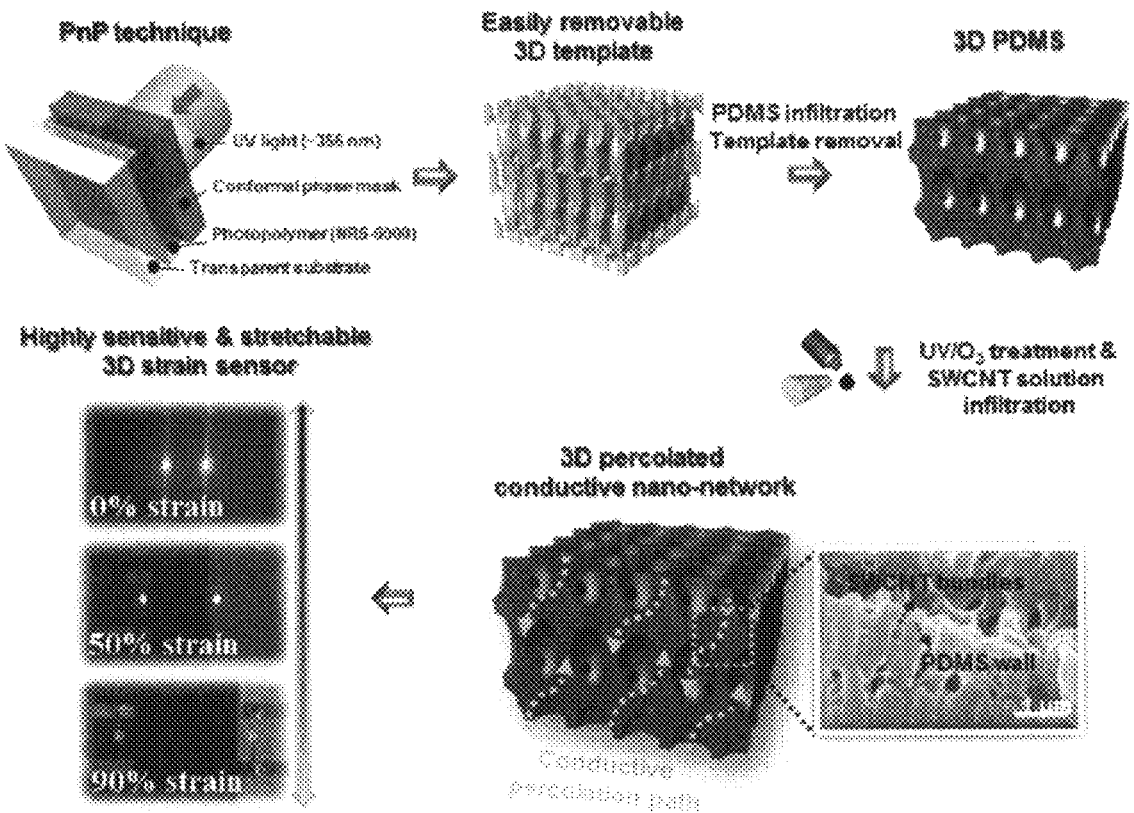
FIG. 2 is a diagram for describing the manufacturing method of FIG. 1.

FIG. 2 is a diagram for describing the manufacturing method of FIG. 1.

Referring to FIG. 2, in the method of manufacturing the highly stretchable 3D percolated conductive nano-network structure according to example embodiments, the 3D nano-structured porous elastomer (e.g., a 3D PDMS in FIG. 2) including the patterns distributed in the periodic network is formed (step S100 in FIG. 1).

In step S100, a photoresist layer (e.g., a Photopolymer in FIG. 2) may be formed on a substrate (e.g., a Transparent substrate in FIG. 2) first.

The substrate may be provided as a supporting body for forming the photoresist layer. A material of the substrate may not be particularly limited. For example, the substrate may have a low reflectance to ultraviolet light and may have a material resistant to an organic solvent in order to remove a polymer template in a subsequent process or treatment. In some example embodiments, a glass substrate such as a cover glass or a slide glass may be used as the substrate.

In some example embodiments, an anti-reflection layer may be further formed on the substrate.

The photoresist layer may be formed using a photoresist material of negative tone. For example, the photoresist layer may be formed by applying or spreading the photoresist material of the negative tone on the substrate by a spin coating process.

In some example embodiments, a pre-treatment or a pre-processing may be performed on the substrate before the photoresist layer is formed on the substrate. For example, the pre-treatment may include an air-plasma treatment. A surface of the substrate may be cleaned by the pre-treatment and at the same time a hydrophilicity of the surface of the substrate may be improved or increased by the pre-treatment. Thus, an affinity between the photoresist material and the surface of the substrate may be improved or increased.

After the photoresist layer is formed, a photoresist pattern (e.g., a 3D template in FIG. 2) having a porous structure may be formed by patterning the photoresist layer.

In some example embodiments, the photoresist layer may be patterned based on a proximity field nano-patterning (PnP) scheme, and thus the photoresist pattern having a periodic 3D porous nano-structured pattern may be formed by the PnP scheme.

The PnP scheme represents a polymeric material processing technique for patterning a polymeric material (or a polymer material) using a periodic 3D distribution generated from interference of light transmitted through a phase mask. For example, when a flexible, elastomer-based phase mask having a concavo-convex grid (or lattice) structure on its surface is brought into contact with a photoresist or the photoresist layer, the phase mask may naturally come into contact with the photoresist surface based on Van der Waals forces. When a laser having a wavelength in a range similar to a grid or lattice period of the phase mask is irradiated on the phase mask surface, a 3D light distribution may be formed by Talbot effect. When a photoresist material of negative tone is used, cross-linking of the photoresist may selectively occur only in portions where light is relatively strongly formed by constructive interference, and remaining portions where light is relatively weakly formed may be dissolved and removed in a developing process because of insufficient exposure dose for cross-linking. When a drying process is performed, a porous polymeric material having periodic 3D structures networked at a level of several hundred nanometers (nm) to several micrometers (μm), sizes of which are determined depending on the wavelength of the laser and a design of the phase mask, may be finally formed.

Specifically, when the PnP scheme is used, a phase mask (e.g., a Conformal phase mask in FIG. 2) including a step structure may be subjected to conformal contact with the photoresist layer coated on the substrate at atomic scale, and then an exposure process may be performed by vertically irradiating a parallel collimated ultraviolet laser (e.g., an UV light in FIG. 2) above the phase mask. A periodic 3D distribution may be formed in the photoresist layer by constructive interference and destructive interference of incident light caused by the step structure of the phase mask.

When the exposed photoresist layer is put into a developer after performing the exposure process, relatively weakly exposed portions may be dissolved and relatively strongly exposed portions may be remained. For example, the developer may be a water-based developer. After then, the photoresist pattern having the periodic 3D porous nano-structured pattern may be formed through, for example, air drying.

After the photoresist pattern is formed, a liquid elastomer may be infiltrated (e.g., a PDMS infiltration in FIG. 2) using the photoresist pattern as a template (e.g., a polymer template).

Specifically, the liquid elastomer may be infiltrated onto the photoresist pattern. After then, an upper surface of the liquid elastomer may be planarized through a spin coating process, or the like, and e.g., nanoscale pores contained in the photoresist pattern may be impregnated without any gap through a vacuum process using a desiccator, a vacuum pump, or the like.

In some example embodiments, the liquid elastomer, which is able to used for infiltration or impregnation, may include one of polydimethylsiloxane (PDMS), PDMS modified urethane acrylate (PUA), perfluoropolyether (PFPE), polyethylene (PE).

In some example embodiments, to provide a predetermined functionality to the liquid elastomer, conductive nanoparticles, carbon nanotubes (CNT), magnetic nanoparticles, semiconductor materials, or the like may be added to the liquid elastomer as required.

After the liquid elastomer is infiltrated, a post-treatment may be performed on the liquid elastomer, and the 3D nano-structured porous elastomer may be obtained by removing (e.g., a Template removal in FIG. 2) the photoresist pattern.

Specifically, a solid elastomeric thin film may be formed through the post-treatment such as heat treatment or ultraviolet treatment in consideration of the type of the liquid elastomer, process conditions, or the like.

In addition, the solid elastomeric thin film formed on the photoresist pattern may be injected into e.g., a template remover, and thus a photoresist-based sacrificial layer and the template (e.g., the photoresist pattern) may be removed together. For example, organic solvents such as acetone, ethanol, N-methylpyrrolidone (NMP), dimethyl sulfoxide (DMSO), other developers, etc. may be used for removing the photoresist pattern. The 3D nano-structured porous elastomer in which the photoresist pattern is reversely transferred may be formed and floated on the organic solvent.

The 3D nano-structured porous elastomer may be recovered or retrieved from the organic solvent and may be dried using air and/or visible light. For example, a spin dryer, a supercritical dryer, or the like may be used to prevent damage to the nano-structure during the drying process.

In some example embodiments, the 3D nano-structured porous elastomer formed by the liquid elastomer may be formed using one of various elastomers such as PDMS, PUA, PFPE, PE, and the like.

After step S100, the surface of the 3D nano-structured porous elastomer may be changed to the hydrophilic state (step S210 in FIG. 1).

In some example embodiments, in step S210, a plasma treatment or an ultraviolet (UV)/ozone ($O_3$) treatment (e.g., an UV/$O_3$ treatment in FIG. 2) may be performed on the 3D nano-structured porous elastomer. Due to nature and structural characteristics of polymeric material, the 3D nano-structured porous elastomer may have super hydrophobicity. A thin silica-like layer may be formed on the surface of the 3D nano-structured porous elastomer by the plasma treatment or the ultraviolet/ozone treatment as described above, and thus an interconnected complex surface of the 3D nano-structured porous elastomer may be surface-modified and changed to a relatively hydrophilic surface.

After step S210, the polymeric material may be conformally adhered on the surface of the 3D nano-structured porous elastomer (step S220 in FIG. 1), and the surface of the 3D nano-structured porous elastomer may be wet by infiltrating (e.g., a SWCNT solution infiltration in FIG. 2) the conductive solution in which the conductive material is dispersed (step S230 in FIG. 1).

Specifically, the polymeric material may be conformally contacted with an exposed upper pattern of the surface-modified 3D nano-structured porous elastomer. For example, the polymeric material may have a relatively low surface energy. Since the surface of the 3D nano-structured porous elastomer is changed into the hydrophilic state, when the conductive solution is flowed from one side of the 3D nano-structured porous elastomer after contacting the polymeric material, all the surfaces of the 3D nano-structured porous elastomer may be completely wetted.

In some example embodiments, the conductive material dispersed in the conductive solution may be any conductive material having any form such as solid, liquid or gas. For example, the conductive material may be based on one of various materials such as carbon nano-tube (CNT), graphene, silver nanowire, liquid metal, and the like. For example, the CNT may be a single-wall CNT (SWCNT) or a multi-wall CNT (MWCNT).

In some example embodiments, the conductive solution may be an aqueous solution or a solution containing an organic solvent.

After steps S220 and S230, the solvent of the conductive solution may be evaporated and the polymeric material may be removed (step S240 in FIG. 1). For example, the solvent of the conductive solution may be evaporated through drying in air at room temperature.

After steps S210, S220, S230 and S240 are completed, the 3D percolated conductive nano-network (e.g., a 3D percolated conductive nano-network in FIG. 2) coupled with the 3D nano-structured porous elastomer may be formed, and finally the highly stretchable 3D percolated conductive nano-network structure including the 3D nano-structured porous elastomer and the 3D percolated conductive nano-network may be obtained. A conductive percolation path (e.g., a Conductive percolation path in FIG. 2) may be formed by the 3D percolated conductive nano-network.

In some example embodiments, the 3D percolated conductive nano-network formed by the conductive solution may include the conductive material based on one of various materials such as CNT, graphene, silver nanowire, liquid metal, and the like.

In some example embodiments, the 3D percolated conductive nano-network may be formed along the surface of the 3D nano-structured porous elastomer. In other words, the 3D percolated conductive nano-network may be formed to coat the surface of the 3D nano-structured porous elastomer.

In other example embodiments, the 3D percolated conductive nano-network may be formed to fill an interior or inside of the 3D nano-structured porous elastomer.

In some example embodiments, as will be described with reference to FIGS. 11 through 14, an electrical characteristic of the 3D percolated conductive nano-network may be determined based on the number of times of infiltration of the conductive solution.

A lower right portion of FIG. 2 shows an electron microscope image of the highly stretchable 3D percolated conductive nano-network structure. A lower left portion of FIG. 2 shows the change in the electrical characteristic of the 3D percolated conductive nano-network due to a tensile strain when the highly stretchable 3D percolated conductive nano-network structure is used as a strain sensor. It may be checked that a resistance of the 3D percolated conductive nano-network increases and thus a brightness of a light emitting diode (LED) lamp decreases as the tensile strain increases (e.g., as the amount of deformation increases with tension).

Figure 3:
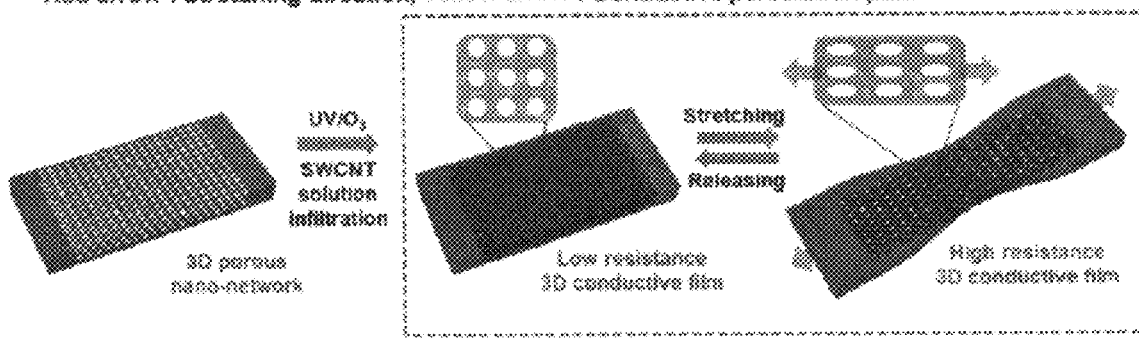
FIGS. 3 and 4 diagrams for describing a change in characteristics of a highly stretchable 3D percolated conductive nano-network structure according to example embodiments due to a tensile strain.
Figure 4:
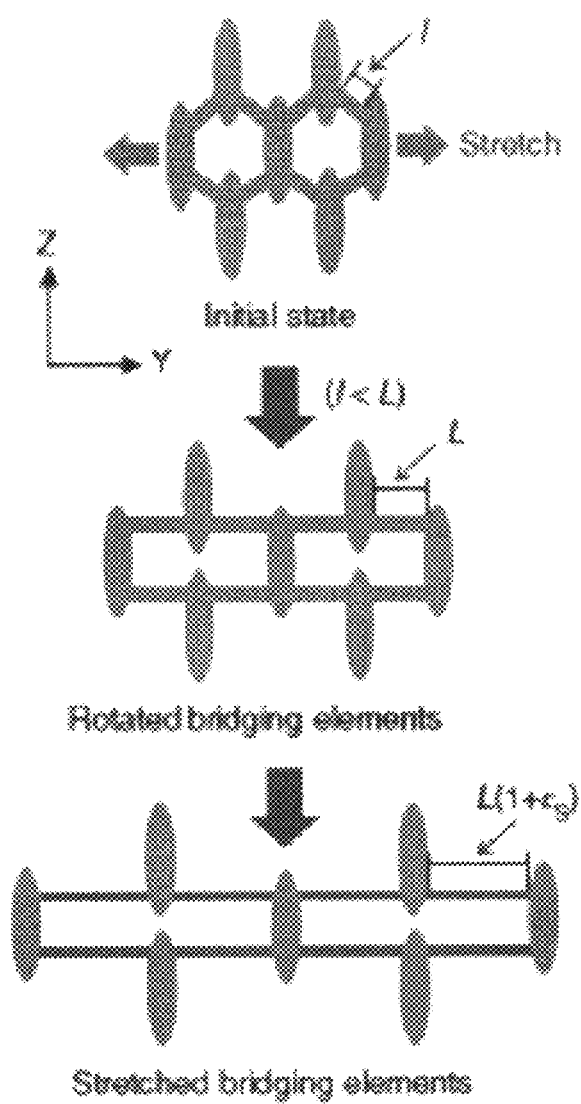

FIGS. 3 and 4 diagrams for describing a change in characteristics of a highly stretchable 3D percolated conductive nano-network structure according to example embodiments due to a tensile strain. In FIG. 3, a relatively thick red arrow indicates a stretching direction or tensile direction of the strain sensor, and a relatively thin yellow arrow indicates a conductive percolation path in the 3D percolated conductive nano-network.

Referring to FIGS. 3 and 4, when the 3D percolated conductive nano-network is formed on a 3D nano-structured porous elastomer through processes such as the ultraviolet/ozone treatment and the infiltration with the conductive solution, the 3D percolated conductive nano-network may not be formed randomly but may be formed along a 3D nano-structure, and thus the 3D percolated conductive nano-network may be efficiently formed with a relatively small amount of conductive material.

In addition, when a stretching or tensile strain is applied to the highly stretchable 3D percolated conductive nano-network structure, the 3D nano-structured porous elastomer included in the highly stretchable 3D percolated conductive nano-network structure may be organically changed to distribute the stretching or tensile strain.

Specifically, as illustrated in FIG. 4, the 3D nano-structured porous elastomer may include center elements that are periodically/regularly arranged and bridging elements that are periodically/regularly arranged to connect the central elements. When the 3D nano-structured porous elastomer is stretched, the bridging elements may be deformed to release the tensile strain, and the stretching limit may be improved.

A length of the bridging element may be "l" before the tensile strain is applied (e.g., at an initial state). When the tensile strain is applied, the length of the bridging element may slightly increase to "L" while the bridging element rotates at an early stage, and the length of the connecting element may further increase to "L(1+$\varepsilon$)" while the bridging element is stretched or elongated after the rotation of the bridging element is completed. Such deformation of the bridging element as described above may be referred to as an organic change. This may be a principle similar to that when the tensile strain acts on the nets, and the 3D nano-structuring of the bulk material may ensure high elasticity over the intrinsic limit of material.

Accordingly, the conductive percolation path in the 3D percolated conductive nano-network formed along the surface of the 3D nano-structured porous elastomer may be flexibly changed with respect to the tensile strain, and the 3D percolated conductive nano-network may have a linear response to the tensile strain than a conventional conductive network that is randomly formed. As a result, the 3D percolated conductive nano-network may increase a degree of deformation to unit tensile strain, may predict the degree of deformation, and may provide a relatively large change in electrical characteristics.

As illustrated in FIG. 3, before the tensile strain is applied to the highly stretchable 3D percolated conductive nano-network structure, the 3D percolated conductive nano-network may have a relatively low initial resistance. When the highly stretchable 3D percolated conductive nano-network structure is stretched or the tensile strain is applied, a contact density of the 3D percolated conductive nano-network may decrease and a resistance of the 3D percolated conductive nano-network may increase. When the highly stretchable 3D percolated conductive nano-network structure is released or the tensile strain is removed, the 3D percolated conductive nano-network may again have the initial resistance.

Hereinafter, the highly stretchable 3D percolated conductive nano-network structure according to example embodiments will be described in detail with reference to specific experimental examples.

Experimental Examples and Applications to Strain Sensors

A cover glass is used as a substrate, and a surface of the substrate is cleaned and hydrophilized by air-plasma treatment. An adhesive film (~8 nm) was formed using a negative tone photoresist NR7-80p (trade name) and through a spin coating process at about 3,000 rpm for about 30 seconds. After then, a soft-baking is performed at about 85° C. for about 2 minutes, a flood exposure is performed with about 365 nm UV lamp, and a hard-baking is performed at about 150° C. for about 2 minutes.

After then, a spin coating process is performed using a negative tone photoresist NR5-8000p (trade name, Futurrex) to form a photoresist layer. Specifically, the spin coating process is performed with NR5-8000p at about 2,000 rpm for about 30 seconds to form a layer having a thickness of about 9 μm, and a solvent is removed by soft-baking at about 90° C. for about 7 minutes and about 130° C. for about 5 minutes.

The photoresist layer is patterned using the PnP scheme and the development process described above to form a photoresist pattern having a periodic 3D porous nano-structured pattern. The irradiation dose during the exposure process is controlled to a range of about 60 to 100 mJ/cm$^2$.

The photoresist pattern is used as a polymer template for infiltrating a liquid elastomer, PDMS (~2 MPa) having a relatively low tensile strain is used as the liquid elastomer, and the liquid elastomer is cured at about 65° C. for about 2 hours. After then, the photoresist pattern is removed using an organic solvent, a remaining structure is dried, and the 3D nano-structured porous elastomer is obtained.

After then, a surface of the 3D nano-structured porous elastomer is changed to a hydrophilic state by performing the ultraviolet/ozone treatment, a polymeric material is conformally adhered on the surface of the 3D nano-structured porous elastomer, a conductive solution in which a SWCNT is dispersed is flowed to completely wet the conductive solution on the surface of the 3D nano-structured porous elastomer, the 3D nano-structured porous elastomer is dried at room temperature for about one day to evaporate a solvent of the conductive solution, the polymeric material is removed to form the 3D percolated conductive nano-network, and thus the highly stretchable 3D percolated conductive nano-network structure including the 3D nano-structured porous elastomer and the 3D percolated conductive nano-network is obtained.

Figure 5:
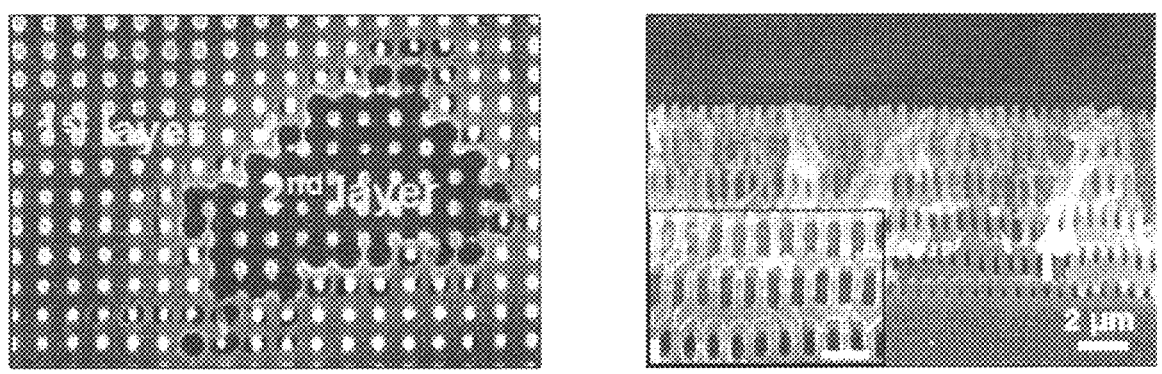
FIGS. 5 and 6 are diagrams for describing characteristics of a photoresist pattern obtained by the manufacturing method of FIG. 1.
Figure 6:
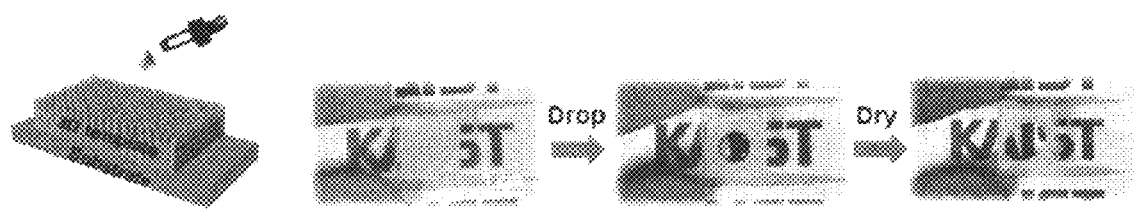

FIGS. 5 and 6 are diagrams for describing characteristics of a photoresist pattern obtained by the manufacturing method of FIG. 1. FIG. 5 shows a photoresist pattern (e.g., the 3D template in FIG. 2) having a 3D nano-structure that is formed on the negative tone photoresist by the PnP scheme. FIG. 6 shows a characteristic in which the photoresist pattern of FIG. 5 is easily removed by an organic solvent.

Referring to FIG. 5, a left image is a plan view of the photoresist pattern, a right image is a cross-sectional view of the photoresist pattern, and all of the left and right images are scanning electron microscope (SEM) images. The photoresist pattern may include a plurality of layers (e.g., two or more layers), and each of the plurality of layers may include patterns distributed in a periodic network.

Referring to FIG. 6, when a drop of the organic solvent is dropped on the photoresist pattern and then dried, it may be checked that the photoresist pattern is removed or erased.

Figure 7:
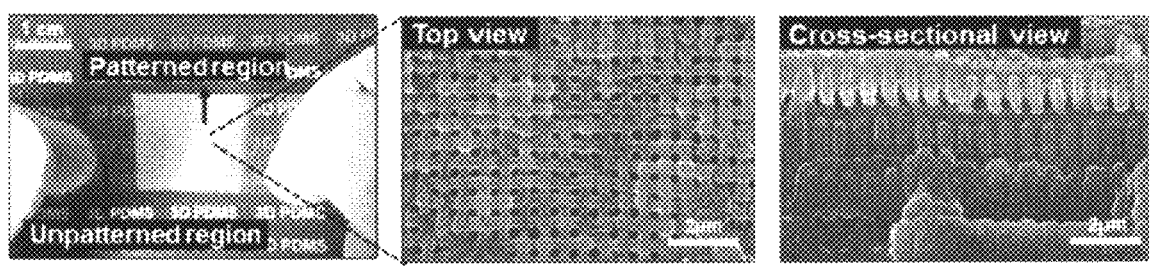
FIGS. 7 and 8 are diagrams for describing characteristics of a 3D nano-structured porous elastomer obtained by the manufacturing method of FIG. 1.
Figure 8:
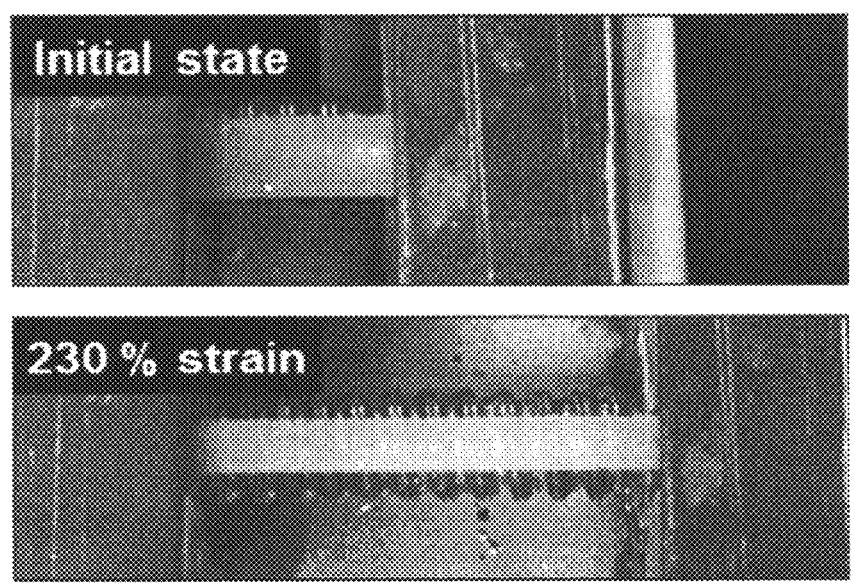

FIGS. 7 and 8 are diagrams for describing characteristics of a 3D nano-structured porous elastomer obtained by the manufacturing method of FIG. 1. FIG. 7 shows a 3D nano-structured porous elastomer (e.g., the 3D PDMS in FIG. 2) that is manufactured by infiltrating PDMS into the photoresist pattern of FIG. 5. FIG. 8 shows a tensile deformation view of the 3D nano-structured porous elastomer of FIG. 7.

Referring to FIG. 7, a left image is a general image of the 3D nano-structured porous elastomer, a patterned region in the left image represents a 3D nano-structured portion, and an unpatterned region in the left image represents a non-nano-structured portion. A middle image is a plan view of the 3D nano-structured porous elastomer, a right image is a cross-sectional view of the 3D nano-structured porous elastomer, and all of the middle and right images are SEM images. As with the photoresist pattern, the 3D nano-structured porous elastomer may include a plurality of layers (e.g., two or more layers), and each of the plurality of layers may include patterns distributed in a periodic network.

In some example embodiments, a size of each of a plurality of pores included in each of the plurality of layers in the 3D nano-structured porous elastomer may be about 1 to 2000 nm. Each of the plurality of pores may have a regular or irregular shape in a direction of each axis (e.g., X, Y, Z axis). The plurality of pores may be three-dimensionally connected to each other or partially connected to each other to form a channel, and the periodic 3D porous nano-structured pattern may be formed by the nano-sized pores and material having the porous nano-structure. By the effect of the strain distribution by the periodic 3D porous nano-structured pattern, a high stretchability over a stretchability limit of bulk material may be implemented.

Referring to FIG. 8, if a length of an initial state of the 3D nano-structured porous elastomer is about 100%, the 3D nano-structured porous elastomer may be deformed up to about 2.3 times (e.g., about 230%) of the initial state.

Figure 9:
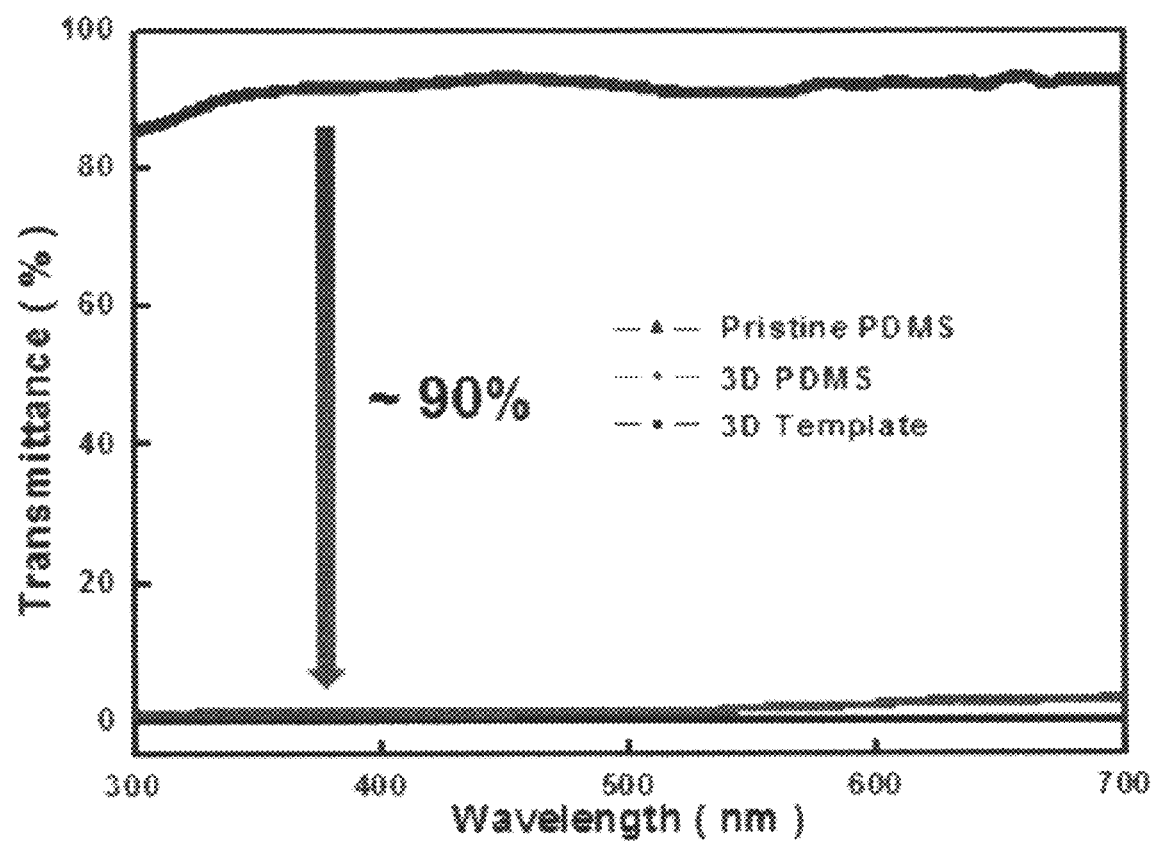
FIGS. 9 and 10 are diagrams for describing characteristics of the photoresist pattern and the 3D nano-structured porous elastomer obtained by the manufacturing method of FIG. 1.
Figure 10:
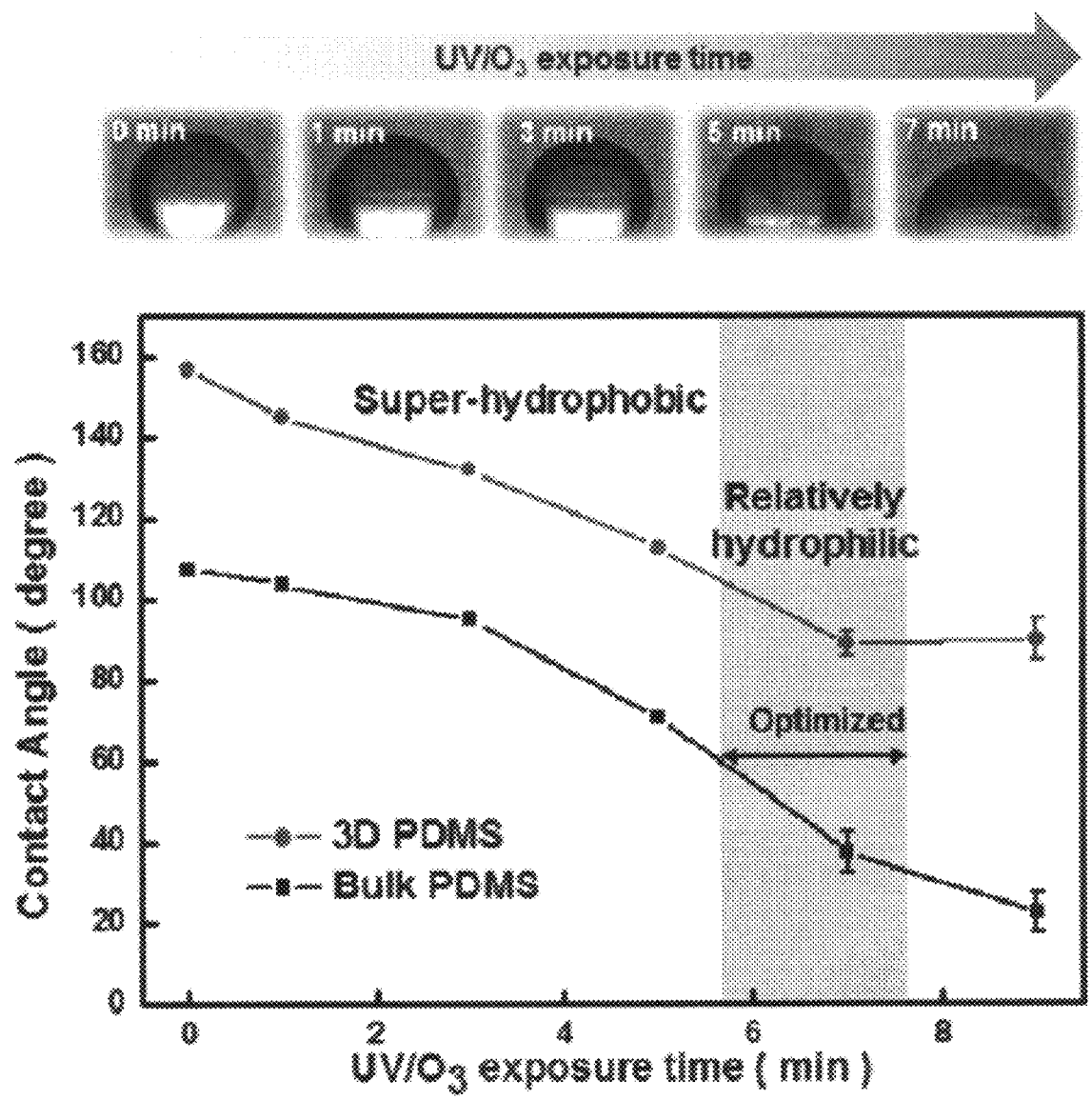

FIGS. 9 and 10 are diagrams for describing characteristics of the photoresist pattern and the 3D nano-structured porous elastomer obtained by the manufacturing method of FIG. 1. FIG. 9 shows a transmittance of the photoresist pattern of FIG. 5 and a transmittance of the 3D nano-structured porous elastomer of FIG. 7 in visible light region. FIG. 10 shows a change in surface characteristics of the 3D nano-structured porous elastomer of FIG. 7 according to the ultraviolet/ozone treatment.

Referring to FIG. 9, a general PDMS (e.g. a Pristine PDMS in FIG. 9), which is an unstructured PDMS or a bulk PDMS, may have a high transmittance of about 85 to 90% in visible light to near-infrared light region. However, in a complex 3D porous structure, incident light may be repeatedly and irregularly scattered due to numerous scattering boundaries existing inside the material. The photoresist pattern (e.g., a 3D template in FIG. 9) manufactured by the PnP scheme and the 3D nano-structured porous elastomers (e.g., a 3D PDMS in FIG. 9) manufactured using the photoresist pattern may have a porosity of at least about 70% and a periodicity of several μm or less, may have a high scattering characteristic in visible light to near-infrared light region, and thus may have a transmittance close to about 0%.

Referring to FIG. 10, when a general PDMS (e.g., a bulk PDMS in FIG. 10) and the 3D nano-structured porous elastomer of FIG. 7 (e.g., a 3D PDMS in FIG. 10) are placed in a chamber and exposed to the ultraviolet/ozone without any direction, a contact angle with respect to water droplet may decrease by lapse of time, and thus it may be checked that surfaces of the general PDMS and the 3D nano-structured porous elastomer are changed from a hydrophobic state to a hydrophilic state. In addition, it may be checked that an optimum hydrophilic state is obtained when an exposure time is about 7 minutes.

Figure 11:
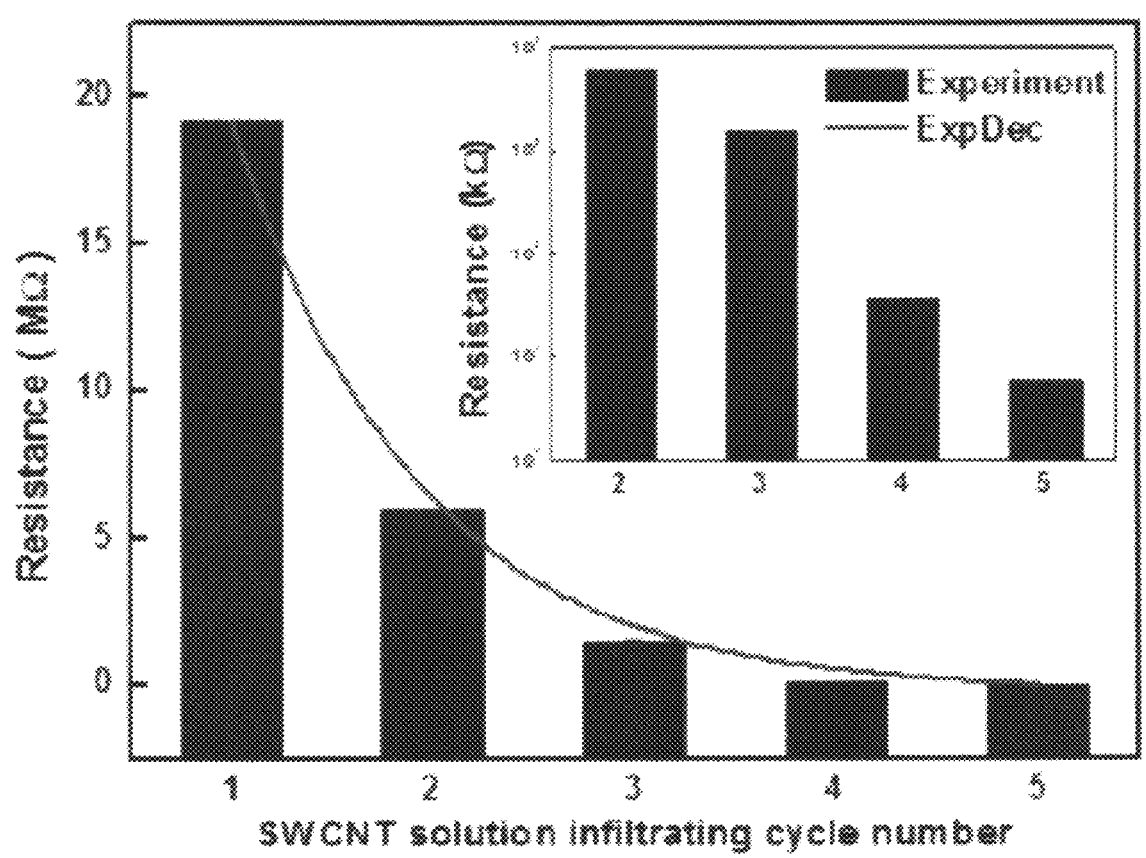
FIGS. 11, 12, 13, 14, 15, 16 and 17 are diagrams for describing characteristics of a 3D percolated conductive nano-network and a highly stretchable 3D percolated conductive nano-network structure obtained by the manufacturing method of FIG. 1.
Figure 12:
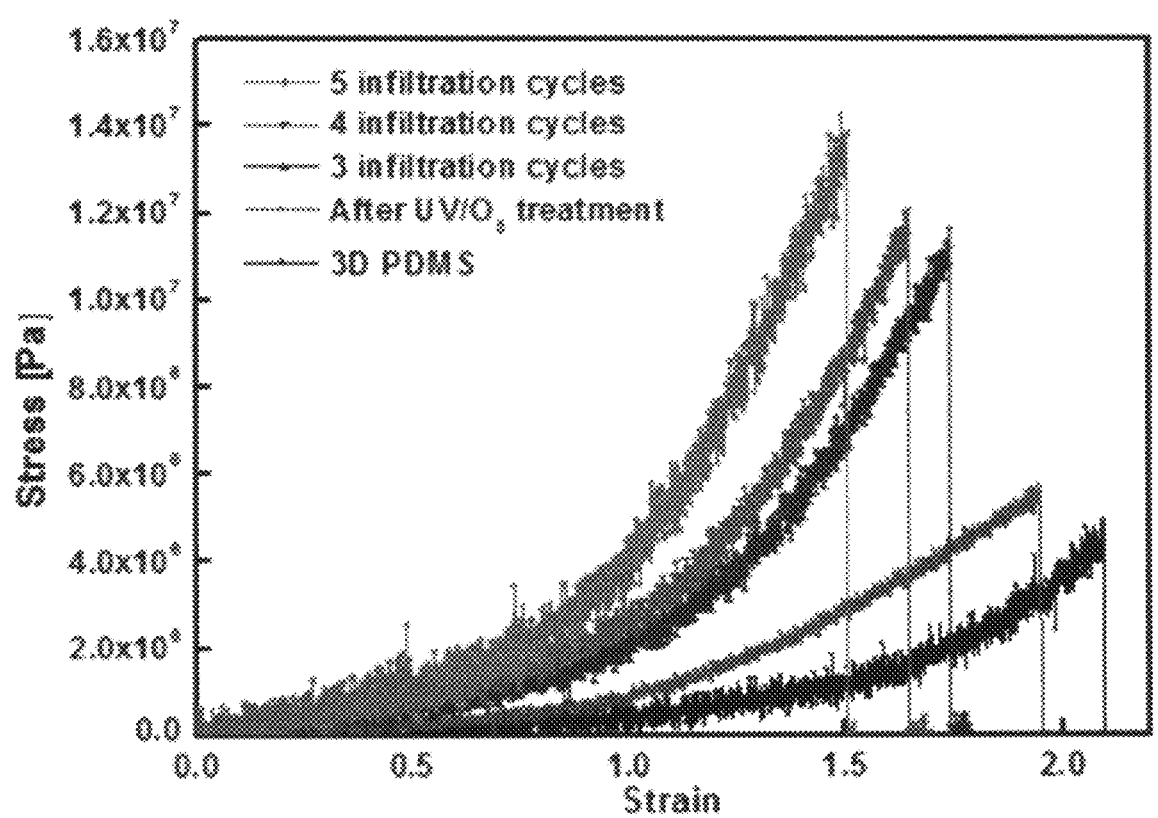
Figure 13:
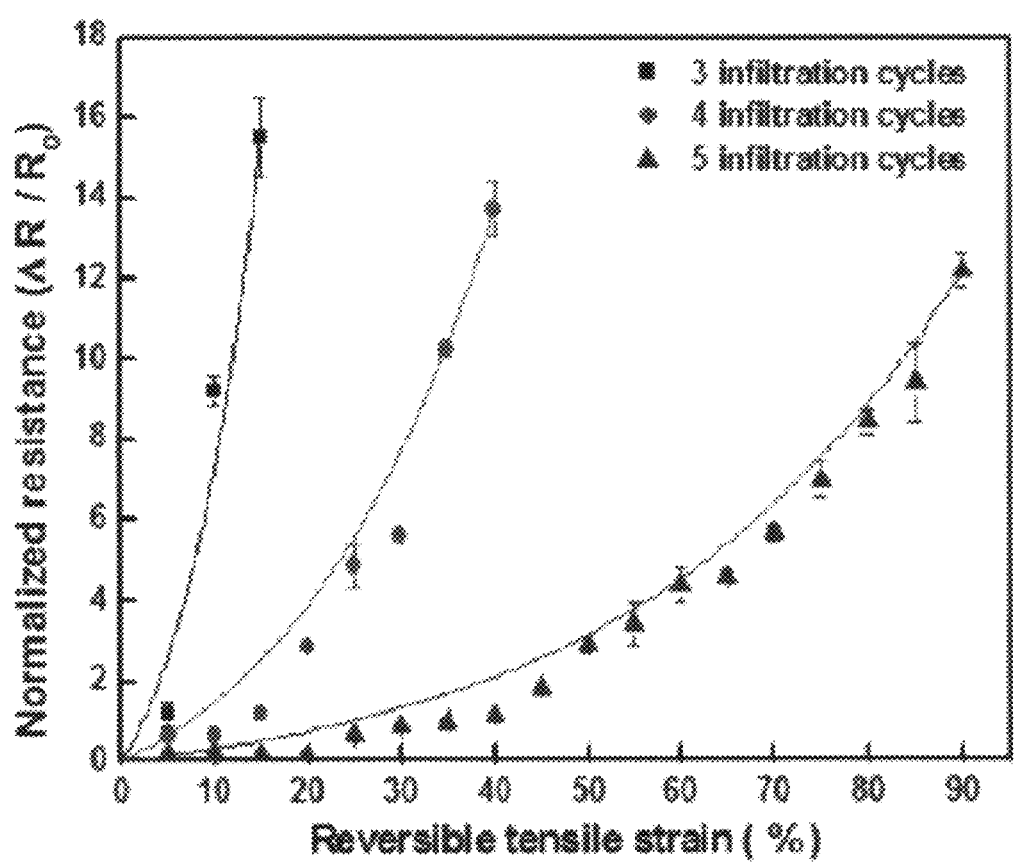
Figure 14:
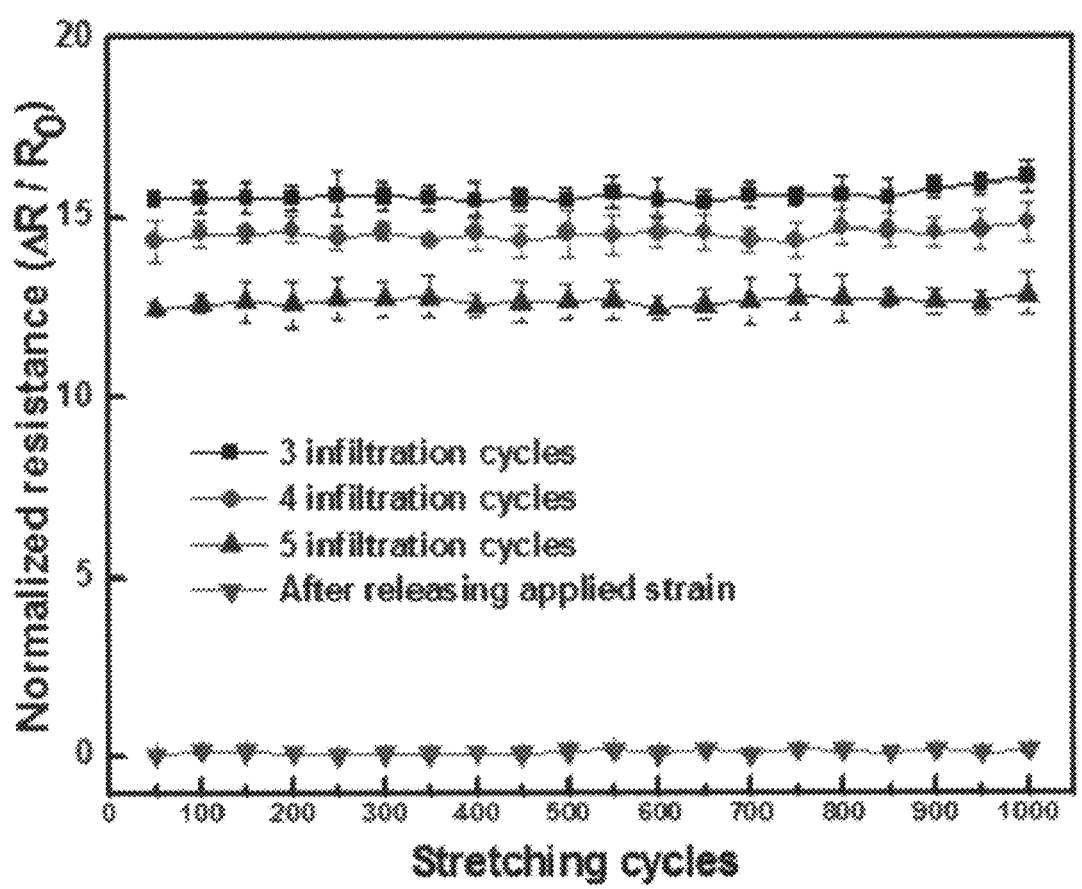
Figure 15:
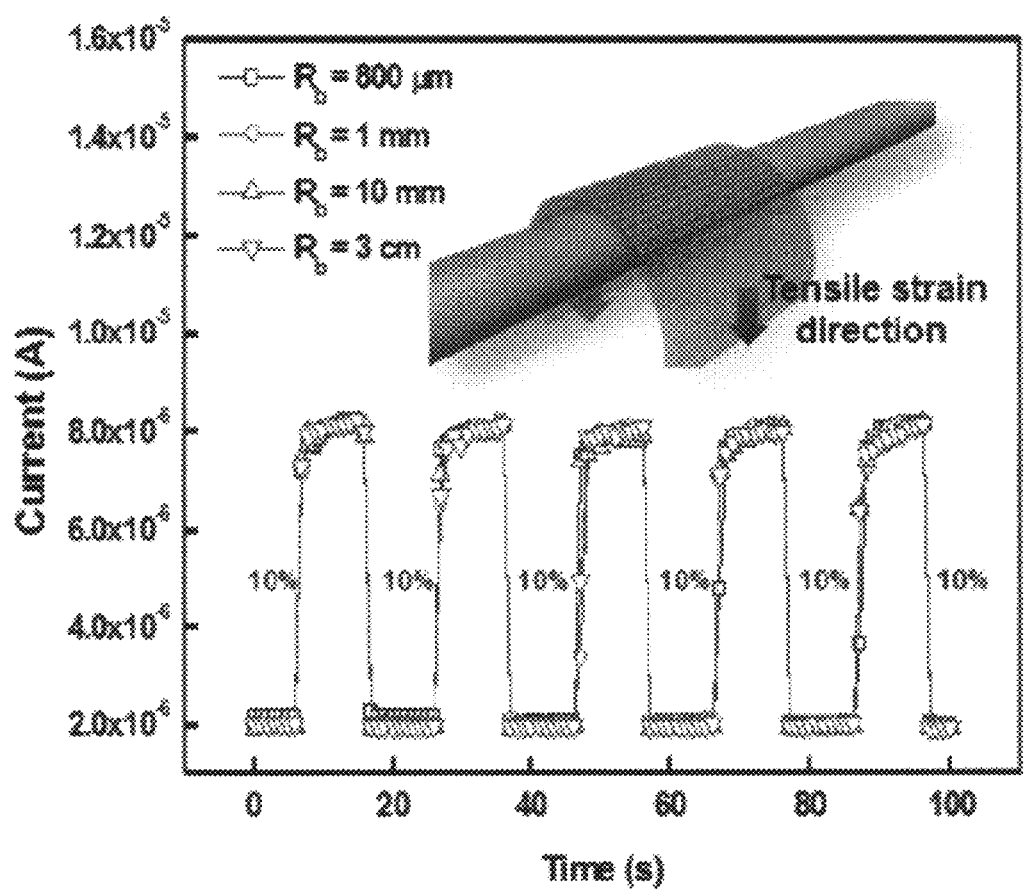
Figure 16:
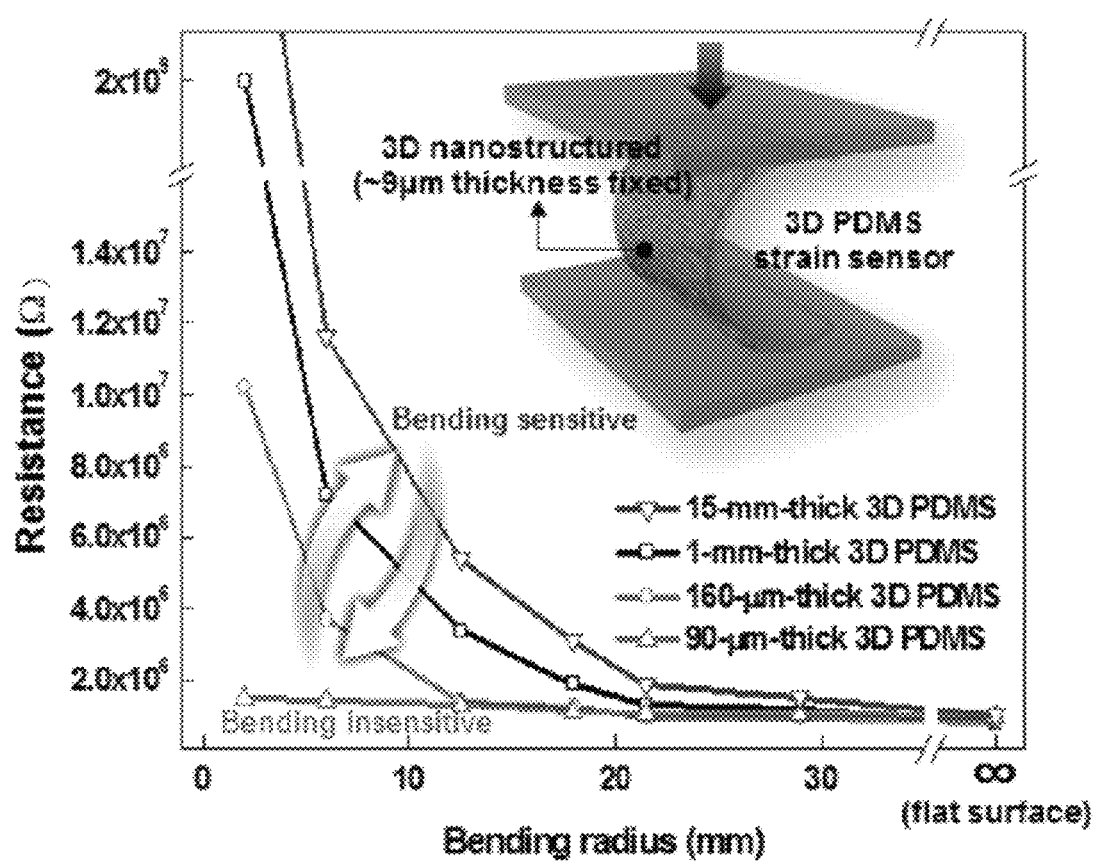
Figure 17:
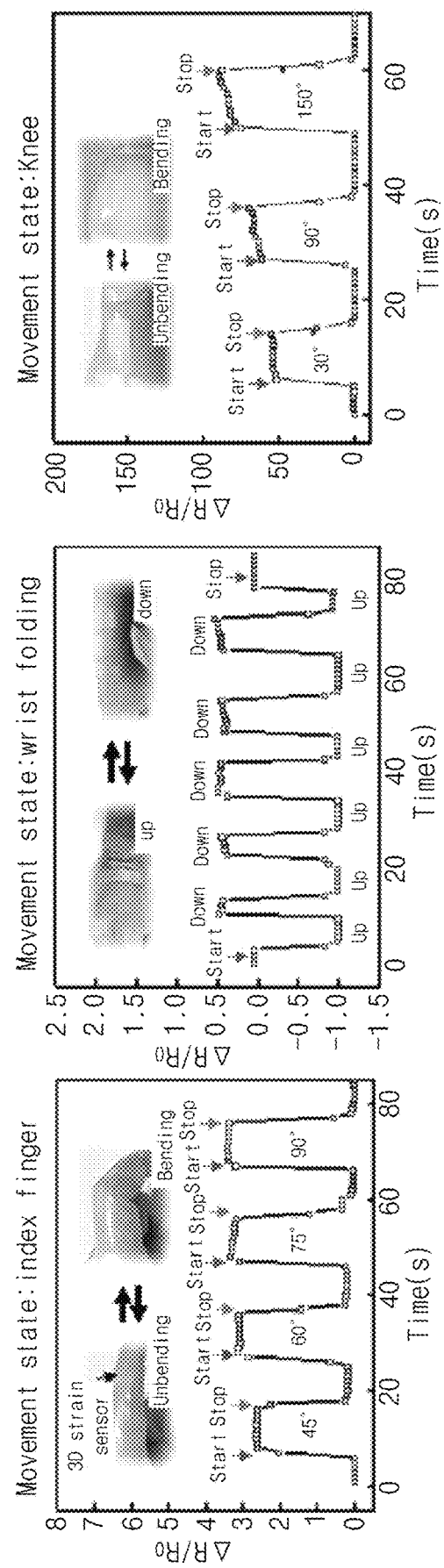

FIGS. 11, 12, 13, 14, 15, 16 and 17 are diagrams for describing characteristics of a 3D percolated conductive nano-network and a highly stretchable 3D percolated conductive nano-network structure obtained by the manufacturing method of FIG. 1. FIGS. 11, 12, 13 and 14 show a change in characteristics depending on the number of times of infiltration of a conductive solution in which a conductive material (e.g., SWCNT) is dispersed. FIGS. 15, 16 and 17 show a change in characteristics associated with bending. FIGS. 11, 13, 14, 15, 16 and 17 show electrical characteristics, and FIG. 12 shows mechanical characteristics.

Referring to FIG. 11, in both an expected value (e.g., an ExpDec in FIG. 11) and an experimental value (e.g., an Experiment in FIG. 11), a density of the conductive material included in the 3D percolated conductive nano-network may increase and an initial resistance of the 3D percolated conductive nano-network may decrease as the number of times of the infiltration of the conductive solution in which SWCNT is dispersed increases.

Referring to FIG. 12, a strain index of the highly stretchable 3D percolated conductive nano-network structure may decrease and a stress index of the highly stretchable 3D percolated conductive nano-network structure may increase as the number of times of the infiltration of the conductive solution increases. For example, in a case of the 3D nano-structured porous elastomer (e.g., a 3D PDMS in FIG. 12), a strain index may be about 2.1, and a stress index may be about $4.0*10^6$. In a case of the highly stretchable 3D percolated conductive nano-network structure in which the conductive solution is infiltrated 5 times, a strain index may be about 1.5, and a stress index may be about $1.4*10^7$. In other words, it may be checked that the elasticity or flexibility of the highly stretchable 3D percolated conductive nano-network structure decreases but the toughness increases as the number of times of the infiltration of the conductive solution increases.

Referring to FIG. 13, a range of reversible tensile strain in which the electrical characteristic of the 3D percolated conductive nano-network is maintained may increase as the number of times of the infiltration of the conductive solution increases. For example, when the number of times of infiltration of the conductive solution is 3, 4 and 5, the range of the reversible tensile strain may be about 10, 40 and 90%, respectively. In other words, when the number of times of infiltration of the conductive solution is 5, the electrical characteristic of the 3D percolated conductive nano-network may be maintained even if the highly stretchable 3D percolated conductive nano-network structure is deformed up to about 190% of the initial state.

In addition, as shown in FIG. 13, the tensile strain of the highly stretchable 3D percolated conductive nano-network structure and the amount of resistance change of the 3D percolated conductive nano-network (that is, a ratio of an initial resistance Ro to a resistance ΔR after the deformation) may have a relatively linear relationship. In other words, the resistance of the 3D percolated conductive nano-network may relatively linearly change according to continuous stretching of the highly stretchable 3D percolated conductive nano-network structure. This may be because the 3D percolated conductive nano-network is not formed randomly but is formed along the 3D nano-structured porous elastomer.

Referring to FIG. 14, it may be checked that the electrical characteristics of the 3D percolated conductive nano-network is maintained without degradation even if stretching of the highly stretchable 3D percolated conductive nano-network structure with the tensile strain of about 10, 40 and 90%, which is the range of the reversible tensile stress, is repeated about 1000 times for the case where the number of times of infiltration of the conductive solution is 3, 4 and 5, respectively. For example, when the number of times of infiltration of the conductive solution is 5, it may be possible to repeatedly and stably exhibit an electric resistance change of about 13 times for about 90% tensile strain more than 1000 times. It may be checked that the limit of conventional tensile strain is improved.

As described with reference to FIGS. 11, 13 and 14, a degree of change in the electrical characteristics with respect to the same tensile strain may be changed according to the density of the conductive material included in the 3D percolated conductive nano-network (e.g., according to the number of times of the infiltration of the conductive solution).

Referring to FIG. 15, it shows a change in electrical characteristic when the tensile strain is applied while bending of the highly stretchable 3D percolated conductive nano-network structure is maintained. It may be checked that a characteristic in which a current increases during stretching in a tensile strain direction and decreases during releasing is regularly repeated regardless of a bending radius (or a radius of curvature) $R_b$ indicating a degree of bending.

Referring to FIGS. 16 and 17, the highly stretchable 3D percolated conductive nano-network structure may be utilized as a strain sensor.

In FIG. 16, it shows a change in electrical characteristic when a thickness of a supporting layer (or backing layer) to which the strain sensor is attached is changed while maintaining a thickness of the highly stretchable 3D percolated conductive nano-network structure.

When the thickness of the support layer is relatively thin (e.g., about 90 μm), a resistance does not change even if a bending radius of the strain sensor decreases (e.g., even if a degree of bending increases). In other words, a variation of the resistance of the strain sensor caused by reduction of the bending radius may decrease and the resistance of the strain sensor may be substantially maintained regardless of bending of the supporting layer as the thickness of the supporting layer decreases (e.g., a bending insensitive case). However, the variation of the resistance of the strain sensor caused by the reduction of the bending radius may increase as the thickness of the supporting layer increases (e.g., a bending sensitive case).

In some example embodiments, it may be controllable, by modifying the thickness of the supporting layer to which the strain sensor is attached, that the strain sensor has a bending insensitive characteristic or a bending sensitive characteristic. In other words, when the thickness of the support layer of the strain sensor is modified to be thicker, the strain sensor may have more bending sensitive characteristic as the thickness of the support layer increases. Thus, in a complex system (e.g., a human body) in which bending and tensile are simultaneously generated, it may be efficiently applied to a method of changing by the tensile strain by separating bending and tensile parameters.

In FIG. 17, a left image shows a change in the resistance of the strain sensor when the strain sensor is attached to an index finger, a middle image shows a change in the resistance of the strain sensor when the strain sensor is attached to a wrist, and a right image shows a change in the resistance of the strain sensor when the strain sensor is attached to a knee.

In the cases of the finger and the knee bent only in one direction, the resistance of the strain sensor may increase according to the bending, and the variation of the resistance of the strain sensor may increase as a bending angle increases. In the case of the wrist bent in both directions, the resistance of the strain sensor may increase or decrease according to the direction of the bending.

In addition, the amount of change in the resistance may be about 3 times of the initial resistance (e.g., $\Delta R/R_0$=about 3) when the finger is bent, and the amount of change in the resistance may be about 50 times of the initial resistance (e.g., $\Delta R/R_0$=about 50) when the knee that is much thicker than the finger is bent. In other words, it may be checked that the variation of the resistance of the strain sensor increases with the bending of the supporting layer as the thickness of the supporting layer increases.

Figure 18:
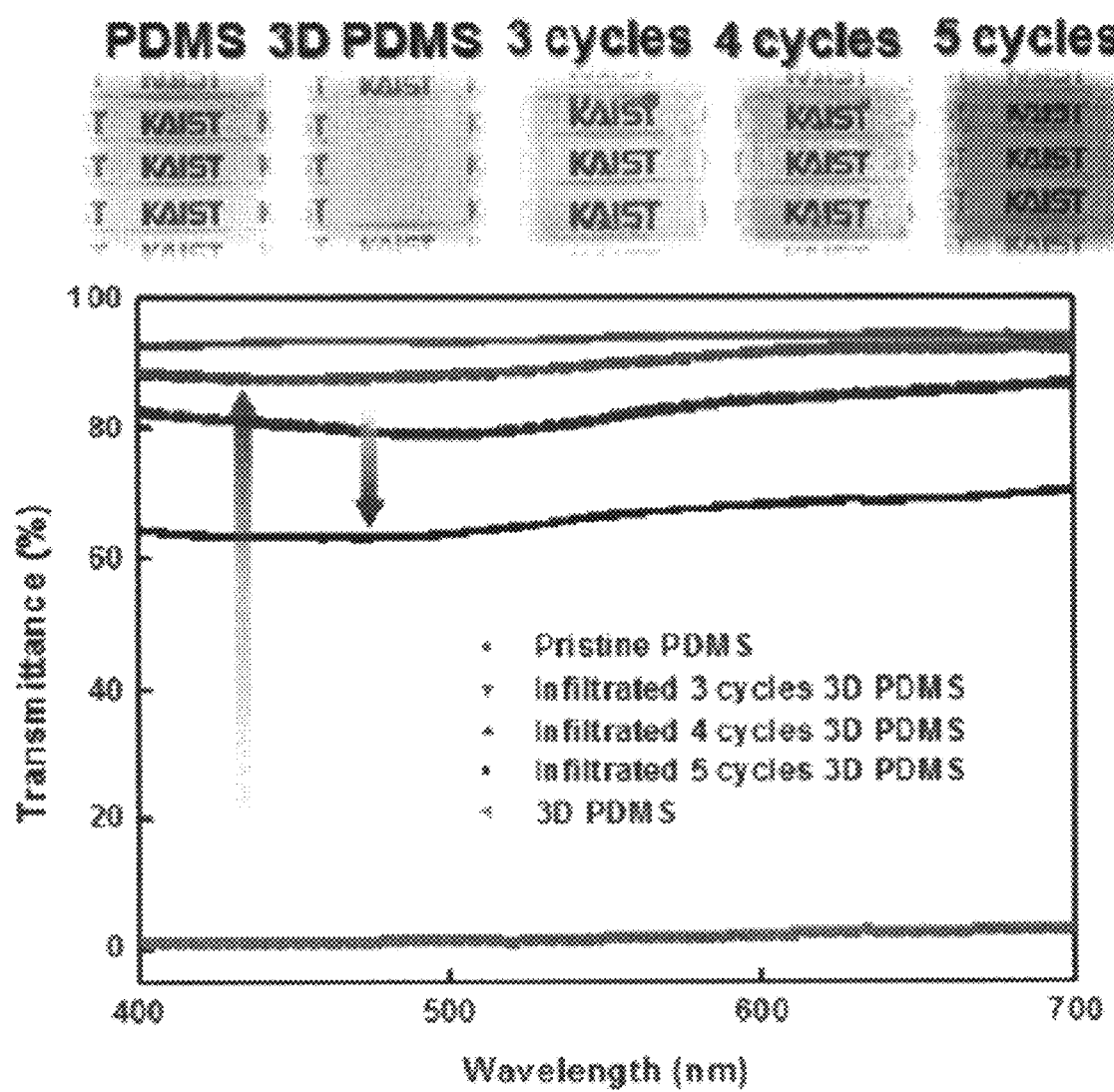
FIGS. 18 and 19 are diagrams for describing characteristics of the highly stretchable 3D percolated conductive nano-network structure according to example embodiments.
Figure 19:
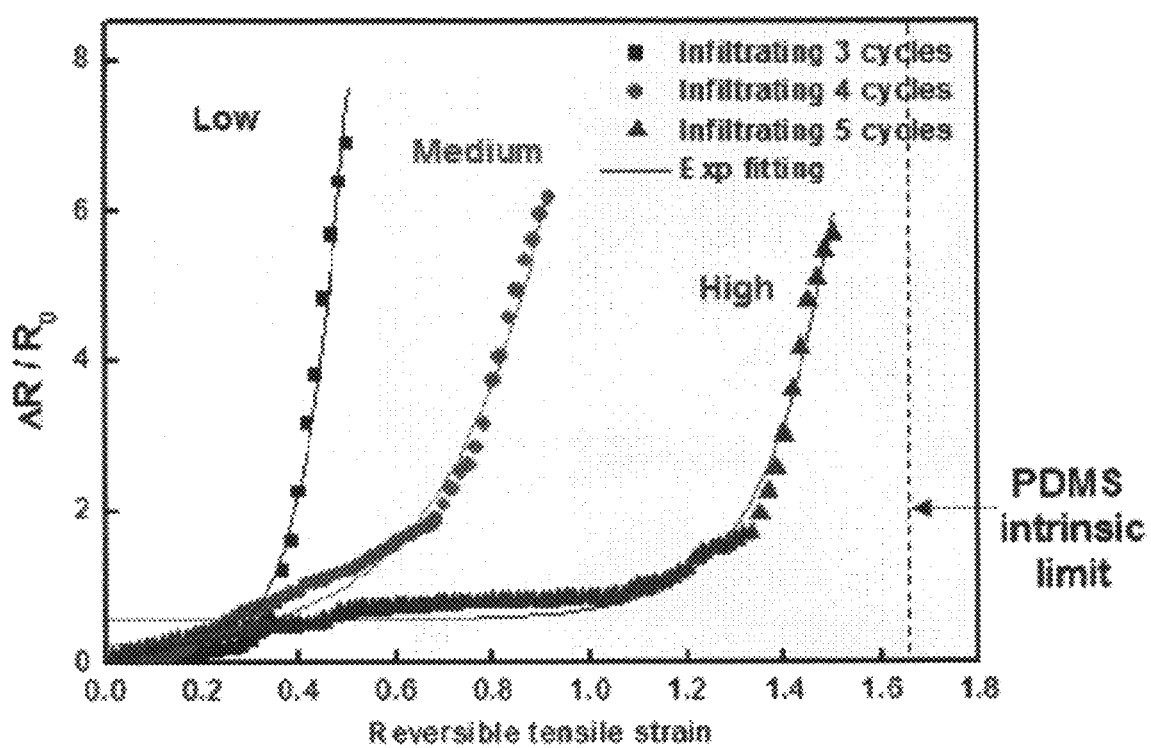

FIGS. 18 and 19 are diagrams for describing characteristics of the highly stretchable 3D percolated conductive nano-network structure according to example embodiments.

Referring to FIG. 18, the highly stretchable 3D percolated conductive nano-network structure according to example embodiments may further include buried patterns. For example, the 3D nano-structured porous elastomer and the percolated conductive nano-network formed along the surface of the 3D nano-structured porous elastomer may include a plurality of pores, and the buried patterns may fill the plurality of pores.

In some example embodiments, the buried patterns may be formed of a material having a refractive index same as that of the 3D nano-structured porous elastomer. For example, the buried patterns and the 3D nano-structured porous elastomer may be formed of the same material (e.g., PDMS). The buried patterns may fill substantially the interior or inside of the pores included in the 3D nano-structured porous elastomer without any gap, and the highly stretchable 3D percolated conductive nano-network structure including the buried patterns may have a substantially bicontinuous structure.

When the pores are filled with a material having the same refractive index, the scattering boundary of the 3D porous structure described with reference to FIG. 9 may be removed or eliminated, and thus a transmittance may increase. For example, as shown by a left arrow in FIG. 18, when the conductive solution is infiltrated into the 3D nano-structured porous elastomer (e.g., a 3D PDMS) three times and the buried patterns are formed by a material having the same refractive index (e.g., a PDMS), the 3D nano-structured porous elastomer may have a transmittance that is lower than that of the unstructured general PDMS (e.g., a pristine PDMS), but higher than about 80%.

In some example embodiments, as shown by a right arrow in FIG. 18, a transmittance of the highly stretchable 3D percolated conductive nano-network structure including the buried patterns may decrease as the number of times of the infiltration of the conductive solution increases. In other words, the transmittance of the highly stretchable 3D percolated conductive nano-network structure including the buried patterns may be controlled according to the number of times of the infiltration of the conductive solution.

Referring to FIG. 19, electrical characteristics of the highly stretchable 3D percolated conductive nano-network structure including the buried patterns may be similar to those described with reference to FIG. 13. For example, a range of reversible tensile strain in which the electrical characteristic of the 3D percolated conductive nano-network is maintained may increase as the number of times of the infiltration of the conductive solution increases. In addition, the resistance of the 3D percolated conductive nano-network may relatively linearly change according to continuous stretching of the highly stretchable 3D percolated conductive nano-network structure including the buried patterns.

Figure 20:
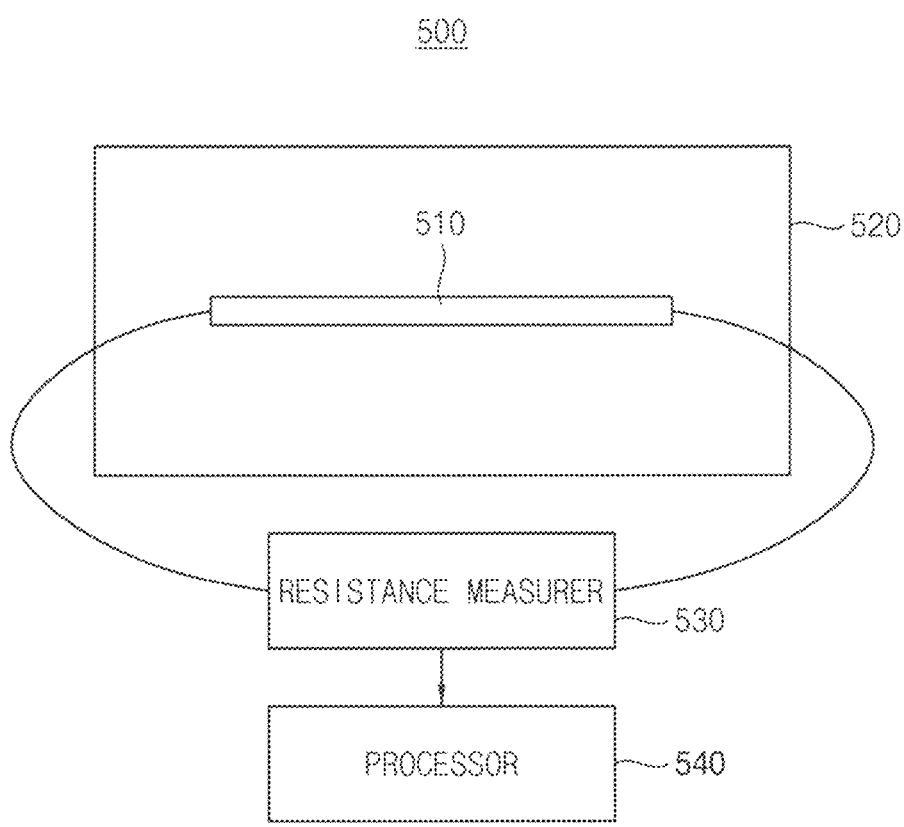
FIG. 20 is a block diagram illustrating a wearable device including a strain sensor according to example embodiments.

FIG. 20 is a block diagram illustrating a wearable device including a strain sensor according to example embodiments.

Referring to FIG. 20, a wearable device 500 includes a strain sensor 510, a flexible frame 520 on which the strain sensor 510 is mounted, and a resistance measurer 530 electrically connected to the strain sensor 510. The wearable device 500 may further include a processor 540.

The strain sensor 510 includes the highly stretchable 3D percolated conductive nano-network structure according to example embodiments. By forming the 3D percolated conductive nano-network within or on the 3D nano-structured porous polymeric material structure, the changes in electrical characteristics according to the tensile strain may be efficiently provided. The highly stretchable 3D percolated conductive nano-network structure may have both high elasticity and large variation of electrical resistance simultaneously and thus may be applied as the strain sensor 510 with high performance.

In some example embodiments, the strain sensor 510 may be manufactured to be most sensitive to required tensile strain region by controlling the electrical characteristics according to the number of times of infiltration or coating of the conductive material. For example, the greater the number of infiltration or coating of the conductive material, the more the conductive material may be connected with a higher density and the higher the conductivity, which requires a lot of tensile force to have a sufficient resistance change. On the contrary, when the number of infiltration or coating of the conductive material is small, it may be applied as a strain sensor which greatly changes based on small tensile strain due to low conductive network density.

The frame 520 may be formed of a flexible material, and may be attached to a human body or worn on the human body. In some example embodiments, the frame 520 may be the supporting layer to which the strain sensor 510 is attached. In other example embodiments, a body part (e.g., a finger, a wrist, an elbow, a knee, etc.) to which the wearable device 500 is attached may be the supporting layer to which the tension sensor 510 is attached.

The resistance measurer 530 may measure a change in the resistance due to the tensile strain applied to the strain sensor 510. The processor 540 may perform a predetermined data processing operation based on an output of the resistance measurer 530.

In some example embodiments, the wearable device 500 may include a smart watch, a wrist band electronic device, a wearable computer, a shoes-type electronic device, a clothes-type electronic device, or the like.

Although the highly stretchable 3D percolated conductive nano-network structure according to example embodiments has been described based on the strain sensor, example embodiments are not limited thereto. For example, the highly stretchable 3D percolated conductive nano-network structure according to example embodiments may be utilized for various types of stretchable electronic devices.

The above described embodiments may be widely applied to a flexible electronic product such as a wearable device, a bio-field, a diagnostic medical field, and a robotics field.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A strain sensor comprising:
    a three-dimensional (3D) percolated conductive nano-network structure,
    wherein the 3D percolated conductive nano-network structure includes:
    a 3D nano-structured porous elastomer including patterns distributed in a periodic network; and
    a 3D percolated conductive nano-network including a conductive material and coupled with the 3D nano-structured porous elastomer,
    wherein the 3D percolated conductive nano-network is formed along a surface of the 3D nano-structured porous elastomer,
    wherein the 3D nano-structured porous elastomer includes a plurality of layers, wherein each of the plurality of layers includes the patterns distributed in the periodic network, and wherein a size of each of a plurality of pores included in each of the plurality of layers is about 1 to 2000 nm.

2. The strain sensor of claim 1, wherein a resistance of the strain sensor is maintained regardless of bending of a supporting layer to which the strain sensor is attached as a thickness of the supporting layer decreases.

3. A wearable device comprising:

a strain sensor including a three-dimensional (3D) percolated conductive nano-network structure;

a flexible frame on which the strain sensor is mounted; and a resistance measurer connected to the strain sensor, wherein the 3D percolated conductive nano-network structure includes:

a 3D nano-structured porous elastomer including patterns distributed in a periodic network; and a 3D percolated conductive nano-network including a conductive material and coupled with the 3D nano-structured porous elastomer, wherein the 3D percolated conductive nano-network is formed along a surface of the 3D nano-structured porous elastomer, wherein the 3D nano-structured porous elastomer includes a plurality of layers, wherein each of the plurality of layers includes the patterns distributed in the periodic network, and wherein a size of each of a plurality of pores included in each of the plurality of layers is about 1 to 2000 nm.

4. The wearable device of claim 3, further comprising:

a processor configured to perform a predetermined data processing operation based on an output of the resistance measurer.

* * * * *